United States Patent [19]

Yagi et al.

[11] Patent Number: 5,454,146
[45] Date of Patent: Oct. 3, 1995

[54] METHOD OF MANUFACTURING A MICROACTUATOR

[75] Inventors: Takayuki Yagi; Hiroshi Takagi, both of Yokohama; Masahiro Fushimi, Zama; Tomoko Murakami, Yamato, all of Japan

[73] Assignee: Canon Kabushiki Kaisha, Tokyo, Japan

[21] Appl. No.: 149,903

[22] Filed: Nov. 10, 1993

[30] Foreign Application Priority Data

Nov. 11, 1992 [JP] Japan .................................. 4-301254

[51] Int. Cl.[6] .................................................. H01L 41/22
[52] U.S. Cl. ........................ 29/25.35; 310/369; 427/100
[58] Field of Search ........................ 29/25.35; 427/100; 310/328, 369

[56] References Cited

U.S. PATENT DOCUMENTS

| | | | |
|---|---|---|---|
| 4,912,822 | 4/1990 | Zdeblick et al. | 29/25.35 |
| 5,187,367 | 2/1993 | Miyazaki et al. | 250/306 |

OTHER PUBLICATIONS

"Fast Scan Piezo Drive", IBM Technical Disclosure Bulletin, vol. 27, No. 10B, pp. 5976 and 5977 (Mar. 1985).
G. Binnig, et al., "Single–Tube three–Dimensional Scanner for Scanning Tunneling Microscopy", Review of Scientific Instruments, vol. 57, No. 8, Part 1, pp. 1688 and 1689 (Aug. 1986).
Shinya Akamine, et al., "Microfabricated Scanning Tunneling Microscope", IEEE Electron Device Letters, vol. 10, No. 11, pp. 490–492 (Nov. 1989).
W. Ehrfeld, et al, "Liga Process: Sensor Construction Techniques Via X–ray Lithography", Solid–State Sensor and Actuator Workshop, Technical Digest, pp. 1–4 (Jun. 1988).
H. Guckel, et al., "Fabrication and Testing of the Planar Magnetic Micromotor", Journal of Micromechanics and Microengineering Structures, Devices and Systems, An Institute of Physics Journal, pp. 135–138 (1991).
Tadashi Shiozaki ed., "Manufacturing and Applications of Piezoelectric Materials", CMC, pp. 19–21 (1985).
Bruno Frazier, et al., "Design and Fabrication of Electroplated Micromotor Structures", Micromechanical Sensors, Actuators, and Systems ASME, DSC–vol. 32, pp. 135–146 (1991).
Kitayama, "Nature and Applications of Piezoelectric Polymers", Denki Yon Gakkai Rengo Taikai, pp. 476–479 (1971).

Primary Examiner—Carl E. Hall
Attorney, Agent, or Firm—Fitzpatrick, Cella, Harper & Scinto

[57] ABSTRACT

A microactuator having a piezoelectric material and a drive electrode formed adjacent to the piezoelectric material is manufactured by forming an electroplating electrode on a substrate and providing a photosensitive material layer on the substrate on which the electroplating electrode is formed. The photosensitive material layer is exposed in a desired pattern. The exposed photosensitive material layer is developed to partially remove the exposed photosensitive material layer. A metal with electroplating is filled in a substrate portion from which the photosensitive material layer is removed, so that a drive electrode is formed. A remaining photosensitive material layer is removed. Finally, a piezoelectric material is selectively filled in a substrate portion adjacent to the drive electrode.

10 Claims, 11 Drawing Sheets

METHOD OF MANUFACTURING A MICROACTUATOR

BACKGROUND OF THE INVENTION

1. Field of the Invention

The present invention relates to a microactuator and, more particularly, to a microactuator using a piezoelectric material and a method of manufacturing the same.

2. Related Background Art

In recent years, actuators for moving small objects to arbitrary positions or directions are important along with the developments of automation and high-precision measurement techniques. Strong demand has also arisen for compact actuators along with the above developments.

A piezoactutor consisting of a material having a piezoelectric effect used in a scanning tunneling microscope (STM) is a typical example of a high-precision moving or positioning drive mechanism. The STM measures a tunneling current between the surface of a conductive serving as a sample and a probe having a very sharp distal end. A drive mechanism for this STM must bring the probe to a position several tens of angstroms or less from the surface of the conductive and must therefore have drive precision on the order of angstroms as moving or positioning precision of the probe. Conventional bulk type piezoactuators include a tripod type piezoactuator (G. Binnig et al., IBM Technical Disclosure Bulletin, vol. 27, no. 10B, 1985, pp. 5976–5977) and a tube type piezoactuator (G. Binnig et al., "Single-tube three-dimensional scanner for scanning tunneling microscopy", Rev. Sci. Instrum., 57(8), 1986, pp. 1688–1689). A piezoelectric material serving as a constituent element is generally formed, starting with blending of raw materials and performing mixing/pulverization (crush), calcination, pulverization (crush), binder mixing, molding, sintering, working, electrode formation, and polarization (Tadashi Shiozaki ed., "Manufacturing and Applications of Piezoelectric Materials", CMC, 1985, pp. 19–21). The bulk type piezoactuator has limitations on the manufacturing method and working precision because it is manufactured by polishing, cutting, and the like.

A micromechanics technique using a silicon planar process has received a great deal of attention as a technique for manufacturing a compact actuator. A variety of actuators are proposed using this technique. Main state-of-the-art microactuators utilize driving force such as the piezoelectric effect of a piezoelectric thin film and an electrostatic force. Of all the microactuators, the microactuator utilizing the piezoelectric effect does not require a clearance required for the electrostatic force and can obtain desired deformation in a self-standing manner. An example is a piezoelectric bimorth actuator (S. Akamine et al., "Microfabricated Scanning Tunneling Microscope" IEEE ELECTRON DEVICE LETTERS, VOL. 10, NO. 11, pp. 490–492 (1989)).

In microfabrication mainly using the silicon planar process, the degree of freedom in design is limited because the two-dimensional surface of a substrate is processed. This is because it is difficult to form a thick layer having a thickness of several microns to several tens of microns so as to deposite a thin film of an actuator material such as a piezoelectric material.

As a method for improving the degree of freedom in the process, an LIGA technique (Lithographie, Galvanoformung, Abformung) using synchrotron radiation light is proposed by W. Ehrfeld et al. of Kernforshungszentrum Karlsruhe (IEEE Solid-State Sensor and Actuator Workshop, Hilton Head. S.C., 1988, Technical Digest pp. 1–4). In addition, a technique capable of manufacturing a freer three-dimensional structure by forming a sacrificial layer in the LIGA technique is also proposed (H. Guckel et al., "Fabrication and testing of the planar magnetic micromotor", J. Micromech. Microeng., 1. 1991. pp. 135–138). Structures proposed as actuators using the LIGA technique require energy fields such as an electrostatic force and a magnetic force and must use drive means with a clearance. An independent operation obtained in use of the piezoelectric effect cannot be achieved.

SUMMARY OF THE INVENTION

It is an object of the present invention to solve the conventional problems described above and to provide a method of easily manufacturing a microactuator capable of obtaining a high-precision displacement utilizing a piezoelectric effect.

In order to achieve the above object, there is provided a method of manufacturing a microactuator, comprising the steps of:

forming an electroplating electrode on a substrate;

providing a photosensitive material layer on the substrate on which the electroplating electrode is formed;

exposing the photosensitive material layer in a predetermined pattern;

developing the exposed photosensitive material layer to partially remove the exposed photosensitive material layer;

filling a metal with electroplating in a substrate portion from which the photosensitive material layer is removed so as to form a drive electrode;

removing a remaining photosensitive material layer; and selectively filling a piezoelectric material in a substrate portion adjacent to the drive electrode.

DETAILED DESCRIPTION OF THE PREFERRED EMBODIMENTS

The preferred embodiments exemplifying basic methods of manufacturing microactuators, bimorph type actuators, stacked actuators, and an STM probe and an X-Y stage which are obtained by applying microactuators of the present invention to STMs, all of which are examples of the present invention, will be described with reference to FIGS. 1A to 12.

First Embodiment

The steps for explaining the first embodiment of a method of manufacturing a microactuator according to the present invention are shown in FIGS. 1A to 1F. Electroplating electrodes 11 are formed on a substrate 10, and a photosensitive material 12 is formed thereon. The substrate may comprise a semiconductor substrate of Si, GaAs, or the like, a ceramic substrate of alumina, quartz, or the like, or a glass substrate. Any kind of substrate can be used. The electroplating electrode can be formed by any method of forming a conductive thin film, such as a vacuum thin film formation method (vacuum evaporation, electron beam deposition, and vacuum sputtering), or a metal electroplating method. The photosensitive material can be formed such that a photoresist used in photolithography in the semiconductor process is coated by spinning, dipping, casting or the like, that a photoresist dry film is adhered on the substrate, or that a photoresist is precipitated by electrodeposition coating.

Figure 1A:
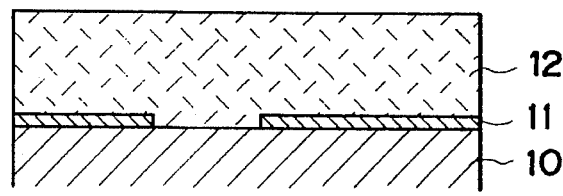
FIGS. 1A to 1F are schematic sectional views for explaining the first embodiment of a method of manufacturing a microactuator according to the present invention.
Figure 1B:
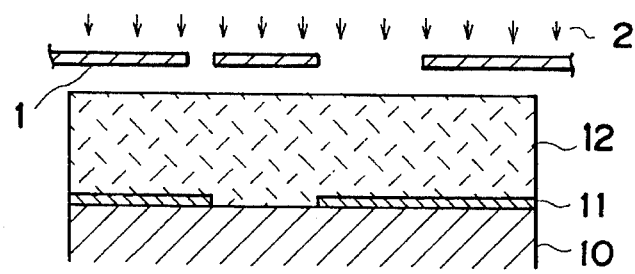
Figure 1C:
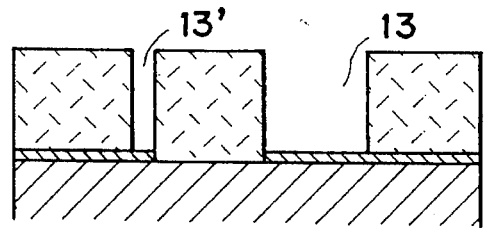

Light 2 is radiated through a photomask 1 by photolithography as shown in FIG. 1B, on the photosensitive material 12 formed using any one of the above methods, as shown in FIG. 1A, thereby exposing a desired portion of the photosensitive material 12. As shown in FIG. 1C, an exposed or nonexposed portion is removed in accordance with the properties of the photosensitive material, thereby forming patterns 13 and 13'. In this embodiment, a positive photosensitive material whose exposed portion is removed by development is used. However, a negative photosensitive material whose nonexposed portion is removed by development can be used.

Figure 1D:
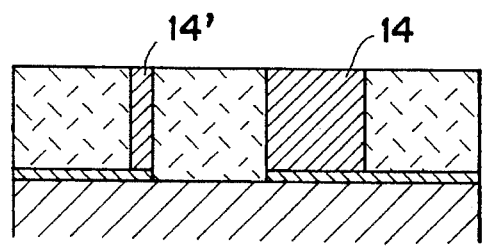
Figure 1E:
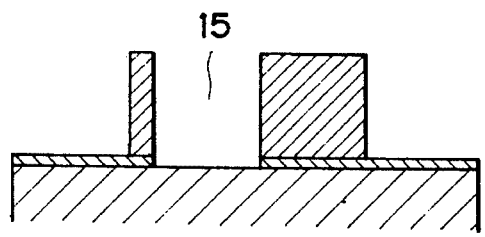
Figure 1F:
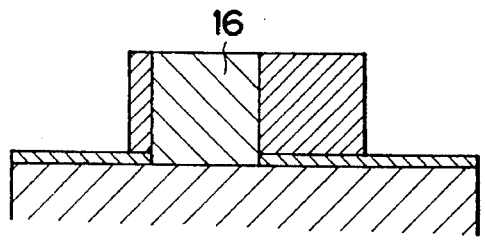

As shown in FIG. 1D, a metal is precipitated in the patterns 13 and 13' on the electroplating electrodes by electrolytic precipitation, thereby forming drive electrodes 14 and 14'. As shown in FIG. 1E, the remaining photosensitive material upon development is removed to form a substrate having metal patterns serving as the drive electrodes 14 and 14'. Finally, a piezoelectric material 16 is filled in a desired filling portion 15 between the metal patterns, as shown in FIG. 1F.

Figure 2:
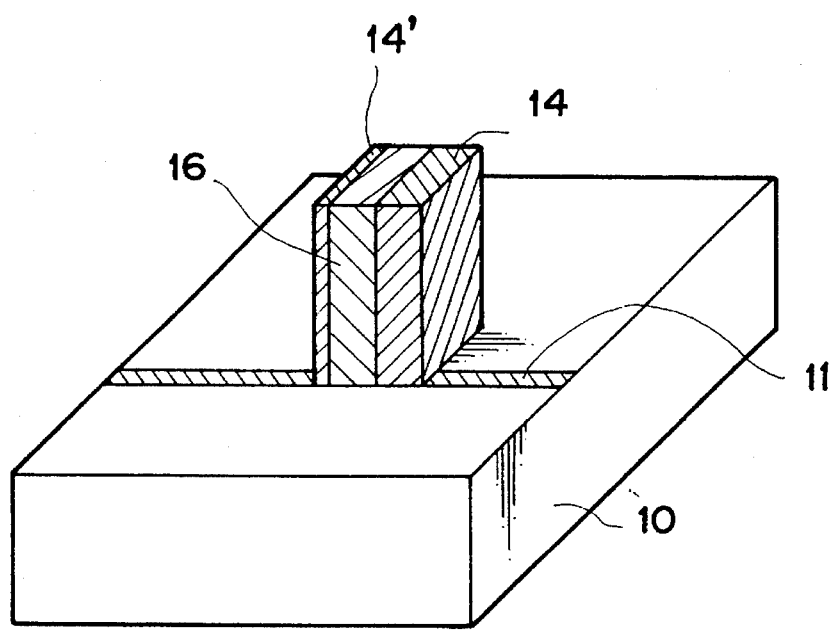
FIG. 2 is a schematic perspective view showing the first example of a microactuator manufactured by the method of the present invention.
Figure 3:
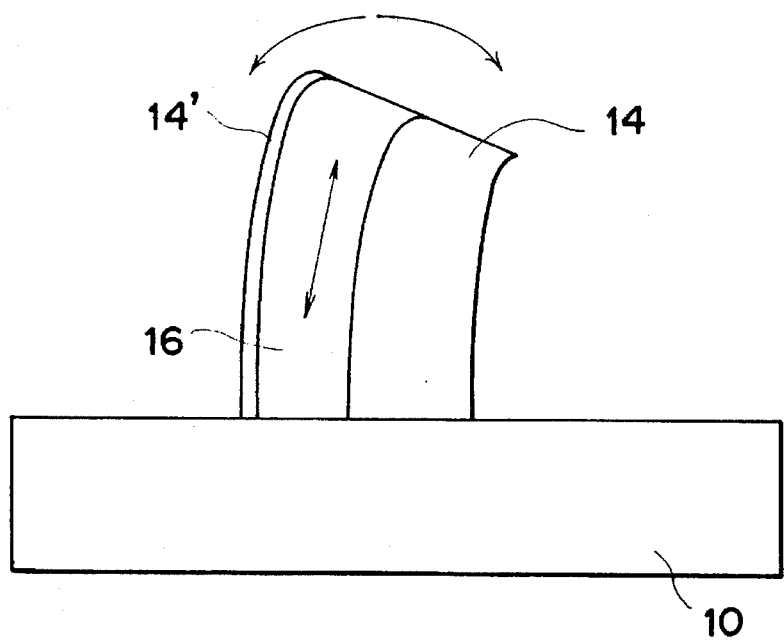
FIG. 3 is a schematic view for explaining the displacement operation of the microactuator manufactured by the method of the present invention.
Figure 4:
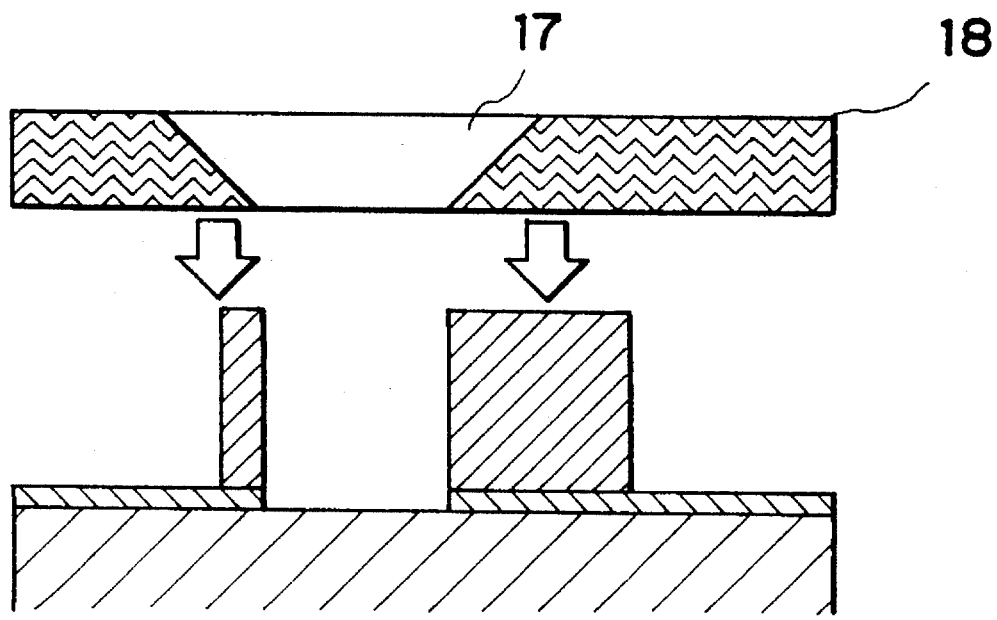
FIG. 4 is a schematic sectional view showing the first example of a method of filling a piezoelectric material according to the present invention.

FIG. 2 shows a piezoelectric actuator manufactured by the above method of the present invention. In the illustrated actuator, a voltage is applied across the drive electrodes 14 and 14' to cause the piezoelectric material 16 to extend or shrink with respect to the drive electrodes 14 and 14'. The piezoactuator is thus displaced in directions indicated by arrows in FIG. 3. A conventional ZnO piezoelectric bimorph actuator (S. Akamine et al.,) has a small displacement in a direction parallel to the substrate surface due to its structure and a maximum displacement in a direction perpendicular to the substrate. To the contrary, the actuator according to the present invention is a piezoelectric actuator having a maximum displacement in the direction parallel to the substrate surface.

The displacement amount of the piezoelectric actuator manufactured by the method of the present invention is determined by the longitudinal dimension of the actuator in the direction perpendicular to the substrate surface, i.e., the thickness of the photosensitive material, the elastic constants of the piezoelectric material to be filled and the drive electrodes, the thicknesses of the layers in the direction parallel to the substrate, and the piezoelectric coefficient of the piezoelectric material to be filled.

The thickness of the photosensitive material varies depending on the requirements of micropatterns in photolithography. When the minimum line width is given as several μm, a photosensitive polyimide described by Bruno Frazier et al. ("Design and fabrication of electroplated micromotor structures" Micromechanical Sensors, Actuators and Systems ASME 1991, pp. 135–146. (1991)) is used to form a structure consisting of a photosensitive material having a thickness of several tens of μm with an ultraviolet ray. It is also possible to use a semiconductor thick film type resist such as an AZ4000 series resist available from Hoechst to form a micropattern of several μm with respect to several tens of μm as the thickness of the photosensitive material. When a photosensitive material having a thickness of 100 μm or more is to be micropatterned, the steps in FIGS. 1A, 1B, 1C, and 1D are repeatedly performed. To increase the dimension in the longitudinal direction in a direction perpendicular to the substrate of the actuator by a single exposure/development cycle to form a high-precision micropattern, the thickness of the photosensitive material is set to 100 to 1,000 μm and synchrotron radiation light is used to form a micropattern of about 1 μm.

Any material can be used as a piezoelectric material to be filled if this material can be filled in the micropattern of the drive electrode, e.g., a piezoelectric polymer, a composite material (Kitayama, "Nature and Applications of Piezoelectric Polymers", Denki Yon Gakkai Rengo Taikai, 1971, pp. 476–479) obtained by dispersing fine piezoelectric particles in a polymer or rubber, a piezoelectric body prepared by Sol-gel deposition methods, or the like can be used. A piezoelectric polymer is generally stretched to improve the piezoelectric properties. A material exhibiting ferroelectric piezoelectric characteristics by polarization with no stretching is preferable in the actuator of the present invention. A material exhibiting ferroelectric piezoelectric properties, such as a copolymer (P-(VDF-TrFE)) of vinylidene fluoride and ethylene trifluoride, is preferable.

A method of selectively filling a piezoelectric material in the desired filling portion 15 between the metal patterns is shown in FIGS. 4 and 5A to 5F. The first method is a method of placing a plate 18 having an injection port 17 corresponding to the portion to be filled on the electrode and filling the piezoelectric material through the injection port.

Figure 5A:
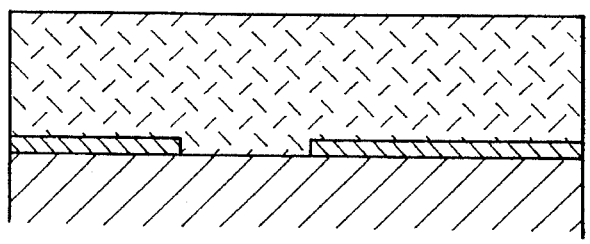
FIGS. 5A to 5F are schematic sectional views for explaining the second example of a method of filling a piezoelectric material according to the present invention.
Figure 5B:
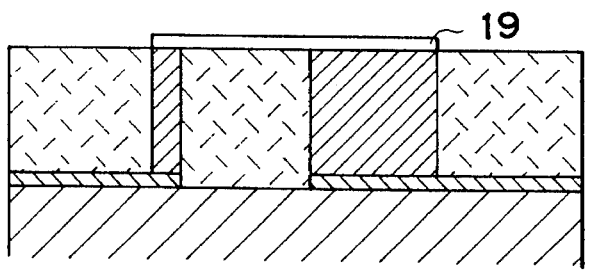
Figure 5C:
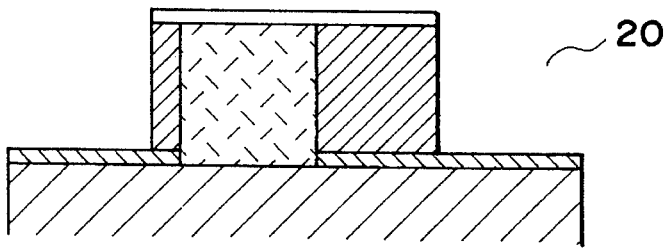
Figure 5D:
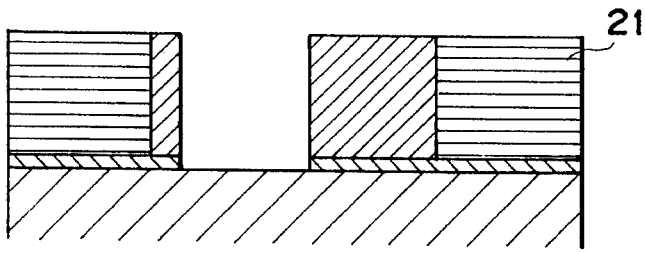
Figure 5E:
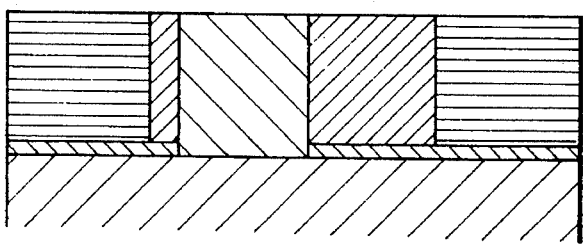
Figure 5F:
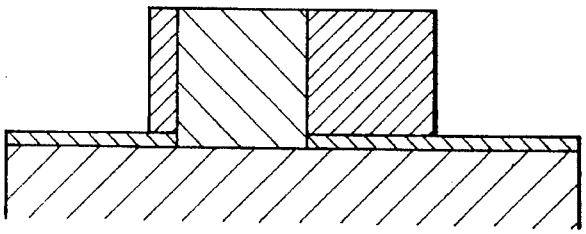

The second method is a method in which an inhibition layer 19 for inhibiting removal of a photosensitive material in only a portion to be filled is formed on the photosensitive material in removal of the photosensitive material, thereby filling the photosensitive material. According to this method, in the same manner as in FIGS. 1A to 1D, a metal is precipitated on an electroplating electrode, and the inhibition layer 19 is formed to obtain a structure in FIG. 5B. The remaining material left upon development is removed to obtain the structure in FIG. 5C. A filling inhibition material 21 is buried in a non-filling portion 20 so as not to fill a piezoelectric material in the filling process. As shown in FIG. 5D, the inhibition layer 19 and the photosensitive material in the filling portion 15 are removed, and the piezoelectric material is coated to fill it in the portion to be filled, as shown in FIG. 5E. Thereafter, as shown in FIG. 5F, the filling inhibition material is removed to selectively fill the piezoelectric material. The piezoelectric material may be mechanically removed except for the filled portion using a blade, thereby removing the piezoelectric material attached to the portion except for the filled portion. A material for forming the inhibition layer may be a material for preventing removal of the photosensitive material from the filled portion in the step of removing the photosensitive material upon development. The filling inhibition material may be any material such as a metal, an insulator, a semiconductor, or a polymer if the drive electrodes and the filled piezoelectric material are not dissolved in removal of the filling inhibition material. A method of burying the filling inhibition material can be a method of coating a polymeric material or a method of electrolytically precipitating a metal. When the metal obtained by electrolytic precipitation is used as the filling inhibition material, an electric insulator is preferably used as the inhibition layer. As compared with the method of FIG. 4, the method in FIGS. 5A to 5F does not require plate positioning because patterning can be performed using photolithography. For this reason, filling in a micropattern can be performed. In particular, when P-(VDF-TrFE) or a composite material obtained by dispersing fine ferroelectric particles of lead zirconate titanate in PVDF is used, a polymeric material soluble in an organic solvent can be used as a filling inhibition material because this composite material has a high resistance to organic solvents.

Second Embodiment

Figure 6:
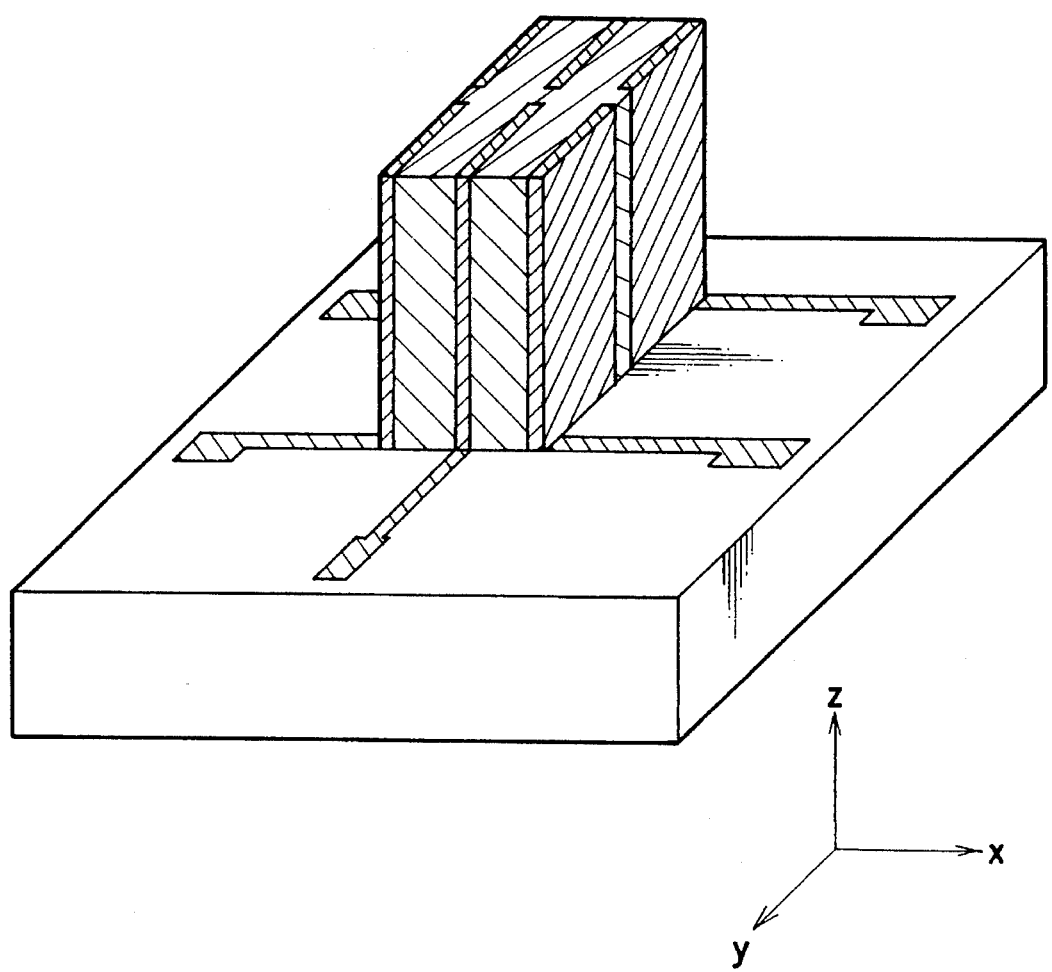
FIG. 6 is a schematic perspective view showing the second example of a microactuator manufactured by the method according to the present invention.

FIG. 6 is a schematic view showing a bimorph type actuator manufactured following the same procedures as in FIGS. 1A to 1F. This actuator can obtain a larger displacement amount than that of the actuator in FIG. 2. Large displacements in the X, Y, and Z directions can be obtained by the arrangement of the drive electrodes shown in FIG. 6. In particular, a large displacement amount in the X direction almost parallel to the substrate can be obtained.

The steps in manufacturing the bimorph type actuator shown in FIG. 6 will be described in detail. A semiconductor resist AZ4620 (tradename) available from Hoechst was coated by dipping to a thickness of 50 μm on an Si substrate having a 0.3-μm thick Ti electroplating electrode. The resist was exposed and developed by photolithography. Ni was electrolytically precipitated on the developed pattern portion to form a drive electrode. The width of the drive electrode pattern was 4 μm, and the width of the filling portion pattern was 6 μm. The steps from coating to Ni electrolytic precipitation were repeated until the height of the drive electrode from the surface of the substrate reached 400 μm. $SiO_2$ was formed to a thickness of 1 μm by vacuum electron beam deposition, and an $SiO_2$ inhibition layer pattern was formed on the drive electrode and the portion to be filled in accordance with photolithography. The resist was removed by acetone, and Au was electrolytically precipitated on the exposed portion. Since the $SiO_2$ film serving as an electric insulator was on the drive electrode, no Au was electrolytically precipitated on the drive electrode. The $SiO_2$ inhibition layer was removed by an aqueous hydrofluoric acid solution, and the resist was removed by acetone from the portion to be filled. A mixture material as a suspension obtained by mixing and dispersing lead zirconate titanate (PZT) as the fine ferroelectric particles in PVDF was flowed on the substrate by melting, the suspension was removed by a blade except for the portion to be filled, and the solvent used in melting was removed. Thereafter, Au was dissolved and removed by an aqueous solution consisting of iodine and potassium iodide, thereby forming the bimorph actuator shown in FIG. 6. A high DC voltage was applied to this actuator to polarize piezoelectric material, thereby obtaining a high piezoelectric coefficient. When a voltage of 200 V was applied to the resultant actuator, a displacement amount of ±0.12 μm could be obtained in the X direction.

Third Embodiment

Figure 7:
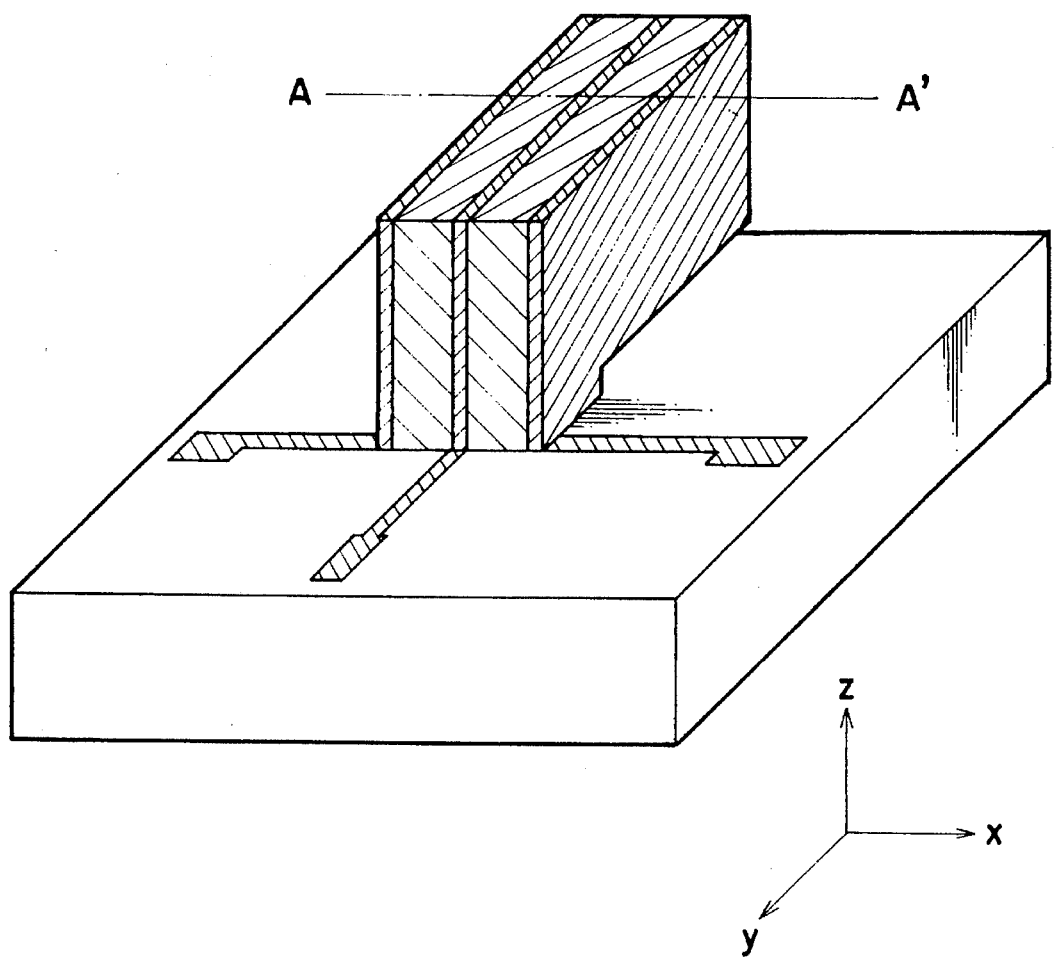
FIG. 7 is a schematic perspective view showing the third example of a microactuator manufactured by the method according to the present invention.

The second example of a bimorph type actuator according to the present invention is shown in FIG. 7. As compared with the actuator shown in FIG. 6, the longitudinal direction of the actuator is a direction parallel to the substrate. The thickness of a photosensitive material need not be much increased, and a larger displacement in a direction parallel to the substrate can be obtained.

Figure 8A:
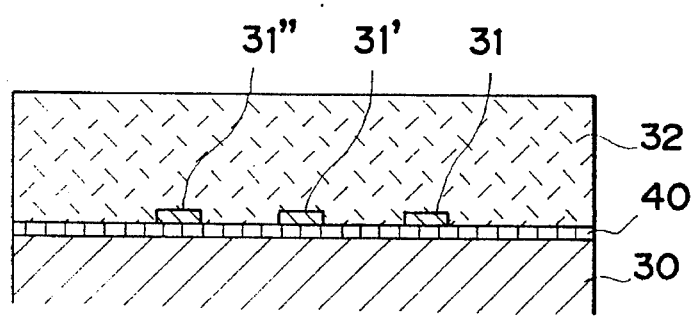
FIGS. 8A to 8E are schematic sectional views for explaining the third embodiment of a method of manufacturing a microactuator according to the present invention.
Figure 8B:
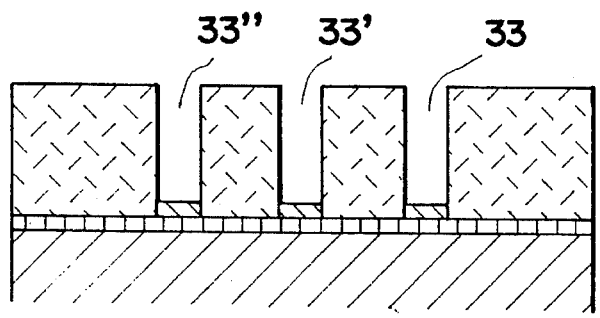
Figure 8C:
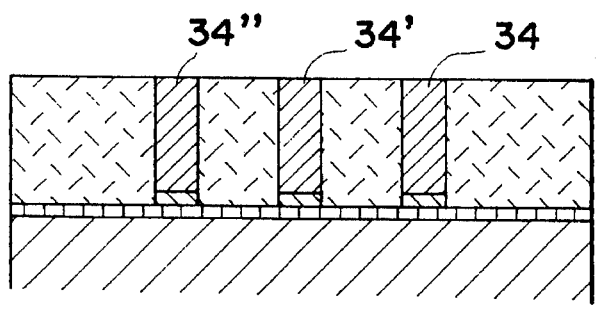
Figure 8D:
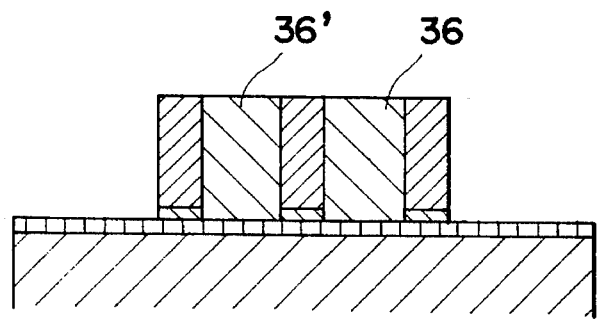
Figure 8E:
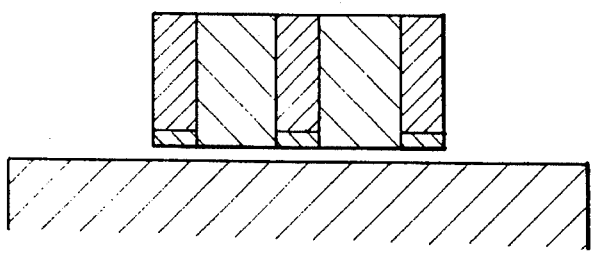

The steps in manufacturing the bimorph type actuator shown in FIG. 7 will be described with reference to FIGS. 8A to 8E. FIGS. 8A to 8E illustrate the states in the section along A—A' in FIG. 7 in these manufacturing steps. As shown in FIG. 8A, a sacrificial layer 40 was formed on a substrate 30, and electroplating electrodes 31, 31', and 31" were formed by patterning. A photosensitive material 32 was coated on the resultant structure. The substrate consisted of molten quartz, a ZnO film formed by sputtering was formed as the sacrificial layer, and only a desired portion was patterned by photolithography. An aqueous acetic acid solution was used as a ZnO etching solution. The electrode and photosensitive material were the same as those used in the manufacture of the actuator in FIG. 6. The resist film had a thickness of 30 μm. The photosensitive material 32 was exposed, developed, and removed to form patterns 33, 33', and 33", as shown in FIG. 8B. As shown in FIG. 8C, Ni was electrolytically precipitated on the electroplating electrode to form drive electrodes 34, 34', and 34". Following the same procedures as in the actuator in FIG. 6, piezoelectric material layers 36 and 36' were filled, as shown in FIG. 8D. Finally, as shown in FIG. 8E, the sacrificial layer 40 was removed by an aqueous acetic acid solution. After polarization, the resultant structure obtained was the bimorph type actuator shown in FIG. 7. The width of the drive electrode pattern was 3 μm, the width of the filled portion pattern was 5 μm, and the length of the sacrificing layer in the direction parallel to the substrate of the actuator was 1 mm. P(VDF-TrFE) was used as the piezoelectric material. When a voltage of 100 V was applied to the resultant actuator, the displacement in the X direction was ±0.3 μm. The displacement in the X direction could be increased by the use of the sacrificial layer without increasing the thickness of the photosensitive material in the direction perpendicular to the substrate. Micropatterning could be performed because the thickness of the photosensitive material was set relatively small.

As described above, the method of manufacturing the actuator with the ultraviolet ray and the actuator manufactured by this method have been described above. However, synchrotron radiation light may be used as an exposure light source to decrease the width of the drive electrode pattern. The pattern widths of the drive electrode and the filled portion can be decreased to drive the actuator at a low voltage.

Fourth Embodiment

Figure 9:
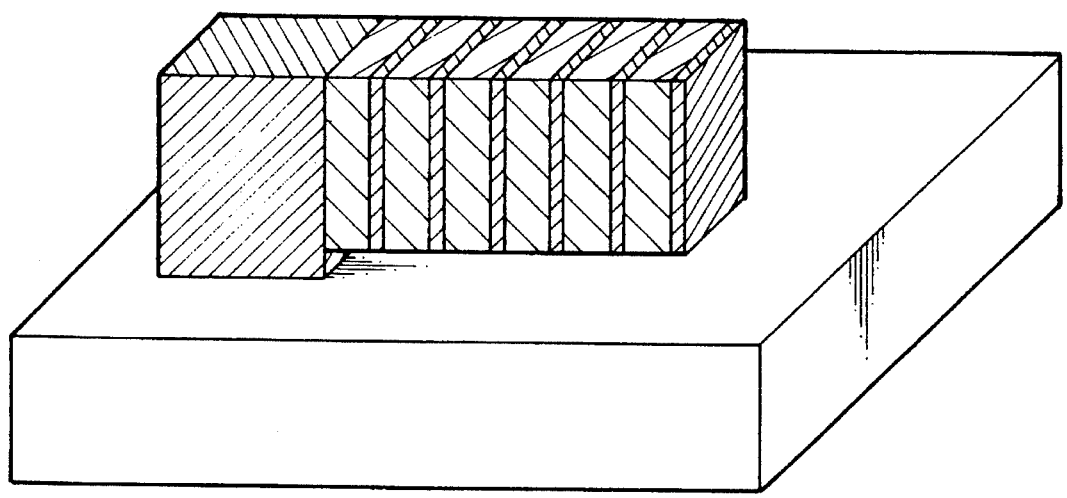
FIG. 9 is a schematic perspective view showing the fourth example of a microactuator manufactured by the method of the present invention.

FIG. 9 is a perspective view of a stacked actuator as still another actuator according to the present invention. The stacked actuator is manufactured using a sacrificial layer following the same procedures as in the bimorph type actuator in FIG. 7. Although not shown, electrodes are alternately and electrically connected through electroplating electrodes. In the actuator of this embodiment, the piezoelectric coefficient is d33, so that requirements associated with micropatterning of photolithography, such as the pattern width of the drive electrode and the thickness of the photosensitive material are less strict. The pattern width of the drive electrode was 5 µm, the pattern width of the filled portion was 10 µm, and the number of filled portions was 100. A material obtained by dispersing fine PZT ferroelectric particles in PVDF was used as a piezoelectric material to be filled. At this time, when a voltage of 170 V was applied, a displacement of ±0.5 µm could be obtained.

Fifth Embodiment

Figure 10:
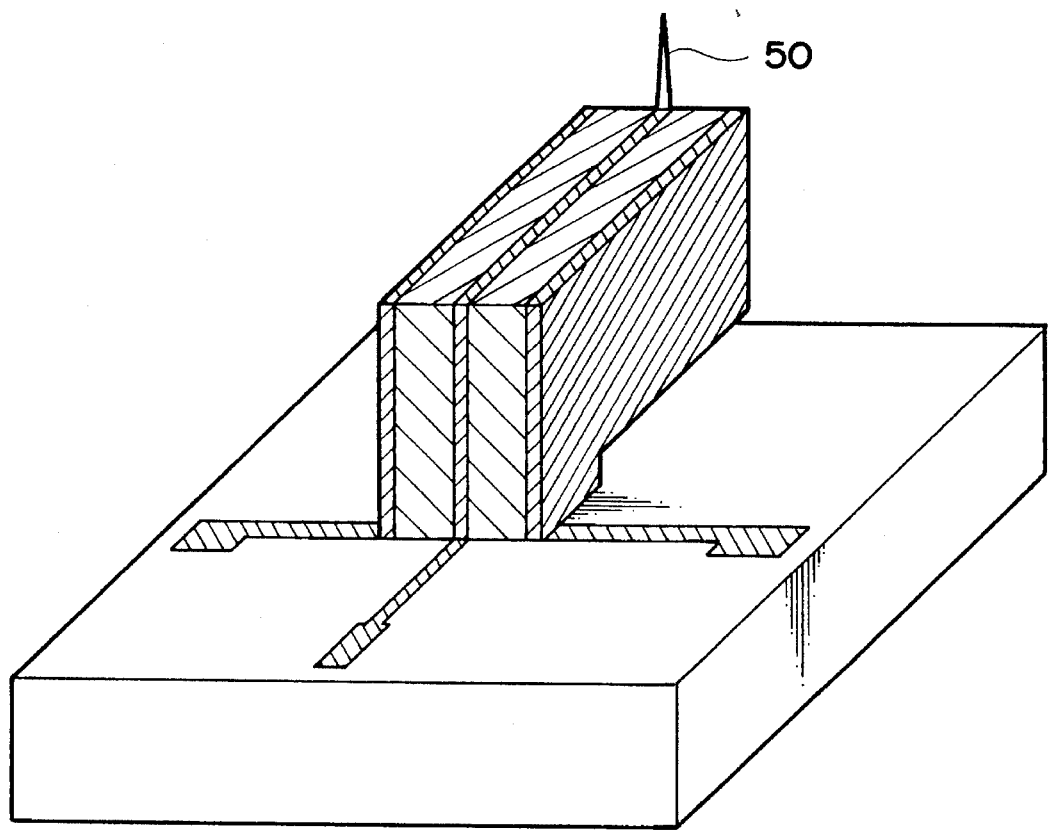
FIG. 10 is a schematic perspective view showing an example of an STM probe using a microactuator manufactured by the method of the present invention.

FIG. 10 is a view for explaining an STM probe applied to an STM. The STM probe is obtained by connecting a tunneling current generation probe electrode 50 to the free end of a bimorph type cantilever of FIG. 7. The conventional ZnO bimorph type actuator proposed by S. Akamine et al. has a maximum displacement in the direction perpendicular to the substrate surface. In the STM probe according to the present invention, the drive direction for maximizing the displacement is a direction parallel to the substrate surface. STM observation can be performed while the measurement surface of a measurement sample is kept scanned. When a plurality of STM probes are arranged on a substrate surface, a plurality of positions on the sample can be simultaneously observed.

Sixth Embodiment

Figure 11:
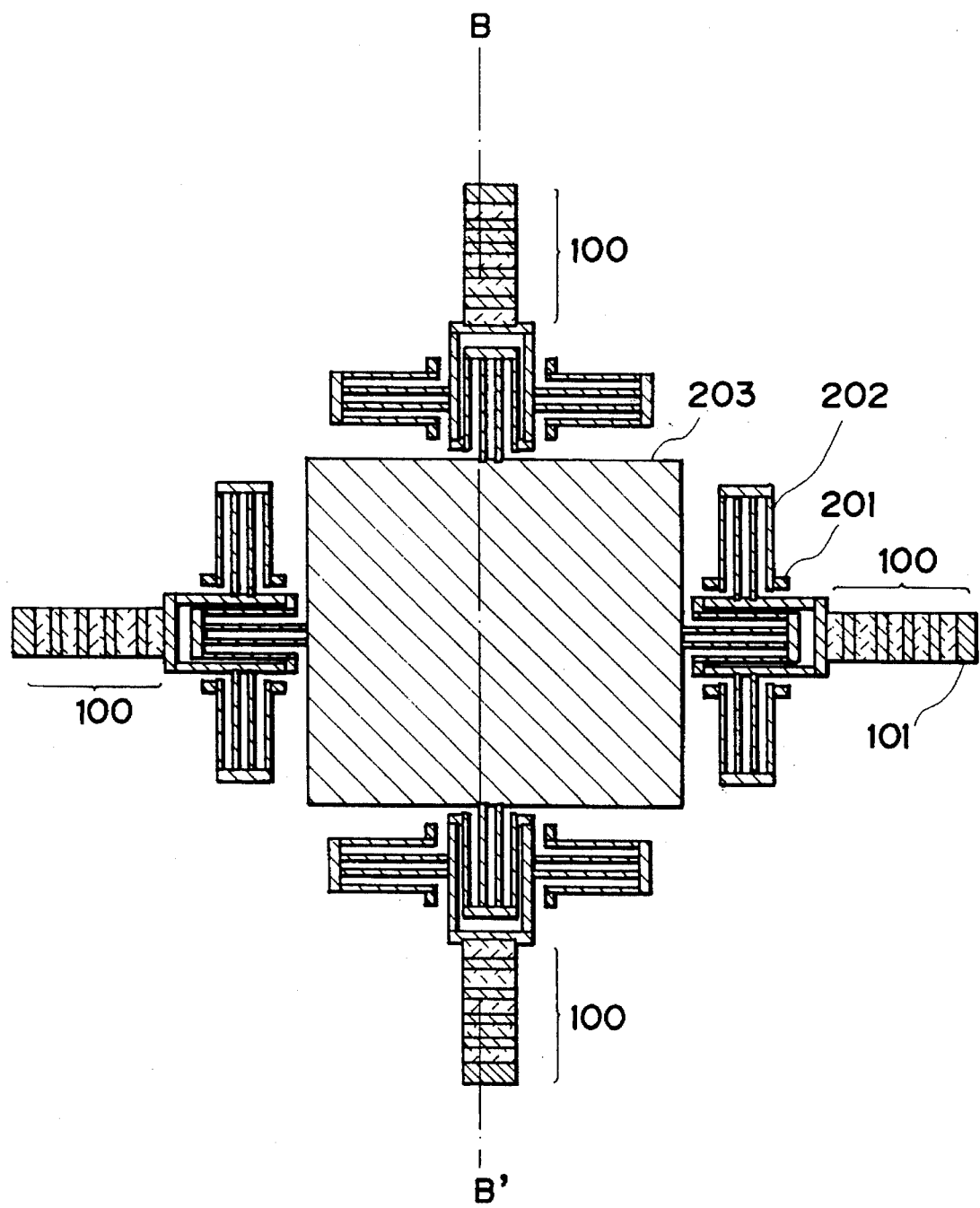
FIG. 11 is a schematic plan view showing an example of an X-Y stage using a microactuator manufactured by the method of the present invention.
Figure 12:
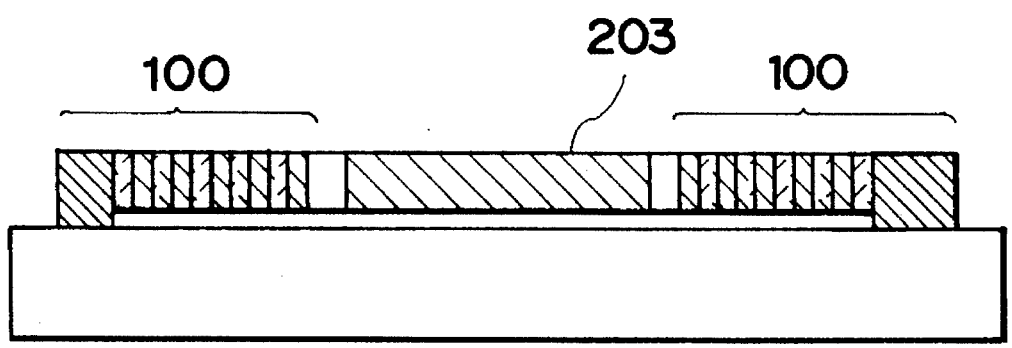
FIG. 12 is a schematic sectional view showing the X-Y stage in FIG. 11.

FIG. 11 is a plan view showing another application in which the present invention is applied to an X-Y stage. FIG. 12 is a sectional view along the line B—B' in FIG. 11. A plurality of stacked actuators 100 shown in FIG. 9 are mounted on a stage 203, and a two-dimensional displacement parallel to the substrate can be obtained through hinges 202. The hinges 202 and the stage 203 are formed on the sacrificing layers as some of the drive electrodes in the manufacture of the stacked actuators. Portions 101 and 201 are contact portions with the substrate at the stacked actuator electrodes and the hinge end portions. In the conventional X-Y stage, the stage portion and the actuator portion are independently manufactured and assembled and connected to each other. However, according to the present invention, the X-Y stage is integrally manufactured by photolithography, thereby assembly errors can be eliminated, additionally due to self-alignment. An X-Y stage free from mechanical cluttering and absorption of a displacement at a connecting portion in use of an adhesive material can be obtained because no connecting portions are used.

As has been described above, a piezoelectric effect is utilized to increase a displacement in a direction parallel to a substrate surface in accordance with an actuator of the present invention and its manufacturing method. Patterns can be simultaneously formed by photolithography to provide an actuator free from mechanical cluttering or assembly errors.

The present invention is not limited to the above embodiment, and various changes and modifications may be made without departing from the scope of the appended claims. All these applications are incorporated in the present invention.

What is claimed is:

1. A method of manufacturing a microactuator, comprising the steps of:

forming an electroplating electrode on a substrate;

providing a photosensitive material layer on said substrate on which said electroplating electrode is formed;

exposing said photosensitive material layer in a predetermined pattern;

developing the exposed photosensitive material layer to partially remove said exposed photosensitive material layer and expose said electroplating electrode in said predetermined pattern;

electroplating a metal onto the exposed electroplating electrode from which said photosensitive material layer is removed so as to form a drive electrode;

removing the remaining photosensitive material layer; and selectively filling a piezoelectric material in a substrate portion adjacent to the drive electrode.

2. A method according to claim 1, further comprising the step of forming a sacrificial layer on part of said substrate prior to formation of said electroplating electrode, and the step of removing said sacrificial layer after said piezoelectric material is filled.

3. A method according to claim 1, wherein the step of removing the remaining photosensitive material layer comprises the step of removing said photosensitive material layer except for a portion adjacent to said drive electrode, the step of burying a filling inhibition material in a portion except for said portion adjacent to said drive electrode, and the step of removing said photosensitive material layer of said portion adjacent to said drive electrode, and said method further comprises the step of removing said filling inhibition material after the step of selectively filling the piezoelectric material.

4. A method according to claim 1, wherein the step of exposing said photosensitive material layer comprises the step of locating a mask having a patterned opening on said photosensitive material layer, and the step of radiating high-energy light on said photosensitive material layer through said mask opening.

5. A method according to claim 1, wherein the step of exposing said photosensitive material layer comprises exposing said photosensitive material layer with high-energy light having a wavelength of not more than 400 nm.

6. A method according to claim 1, wherein the step of exposing said photosensitive material layer comprises exposing said photosensitive material layer with an X-ray.

7. A method according to claim 1, wherein the step of exposing said photosensitive material layer comprises exposing said photosensitive material layer with synchrotron radiation light.

8. A method according to claim 1, wherein said piezoelectric material comprises a piezoelectric polymer.

9. A method according to claim 8, wherein said piezoelectric polymer essentially consists of a copolymer of vinylidene fluoride and ethylene trifluoride.

10. A method according to claim 1, wherein said piezoelectric material essentially consists of a material obtained by dispersing fine ferroelectric particles in one of a polymer and rubber.

* * * * *